US012652051B1

(12) United States Patent
Debroy et al.

(10) Patent No.: US 12,652,051 B1
(45) Date of Patent: Jun. 9, 2026

(54) SYSTEM AND METHOD FOR NANOMAGNET BASED LOGIC DEVICE

(71) Applicant: Ceremorphic, Inc., San Jose, CA (US)

(72) Inventors: Sanghamitra Debroy, Hyderabad (IN); Akshaykumar Salimath, Hyderabad (IN); Venkat Mattela, San Jose, CA (US)

(73) Assignee: Ceremorphic. Inc., San Jose, CA (US)

( * ) Notice: Subject to any disclaimer, the term of this patent is extended or adjusted under 35 U.S.C. 154(b) by 475 days.

(21) Appl. No.: 18/201,077

(22) Filed: May 23, 2023

(51) Int. Cl.
 H03K 19/16 (2006.01)

(52) U.S. Cl.
 CPC .................................... H03K 19/16 (2013.01)

(58) Field of Classification Search
 None
 See application file for complete search history.

(56) References Cited

U.S. PATENT DOCUMENTS

| | | | | |
|---|---|---|---|---|
| 8,134,441 B1 * | 3/2012 | Bokor | .................... | B82Y 25/00 |
| | | | | 335/304 |
| 9,391,262 B1 * | 7/2016 | Nikonov | ................ | H10N 50/85 |

| | | | | |
|---|---|---|---|---|
| 10,447,277 B1 * | 10/2019 | Kazemi | .................. | H10N 50/80 |
| 11,112,468 B2 * | 9/2021 | Braganca | ........... | G01R 33/1269 |
| 11,700,001 B1 * | 7/2023 | Debroy | .................. | H03K 19/18 |
| | | | | 326/104 |
| 12,211,536 B1 * | 1/2025 | Debroy | ................. | G11C 11/161 |
| 2014/0022036 A1 * | 1/2014 | Lambson | .............. | H01F 1/0036 |
| | | | | 977/775 |
| 2015/0341036 A1 * | 11/2015 | Manipatruni | ....... | H01F 10/3268 |
| | | | | 326/101 |

* cited by examiner

*Primary Examiner* — Jany Richardson
(74) *Attorney, Agent, or Firm* — Minisandram Law Firm; Raghunath S. Minisandram

(57) ABSTRACT

A system and method for a logic device is disclosed. A first substrate, a second substrate and a third substrate is provided. A first input nanomagnet is disposed over the first substrate, a second input nanomagnet is disposed over the second substrate, and a third input nanomagnet is disposed over the third substrate. The easy axis of the first input nanomagnet, the second input nanomagnet, and the third input nanomagnet are in a first direction perpendicular to the first substrate, the second substrate and the third substrate. A spacer layer is disposed over the first input nanomagnet, the second input nanomagnet, and the third input nanomagnet. A first ferromagnetic layer is disposed over the spacer layer.

20 Claims, 16 Drawing Sheets

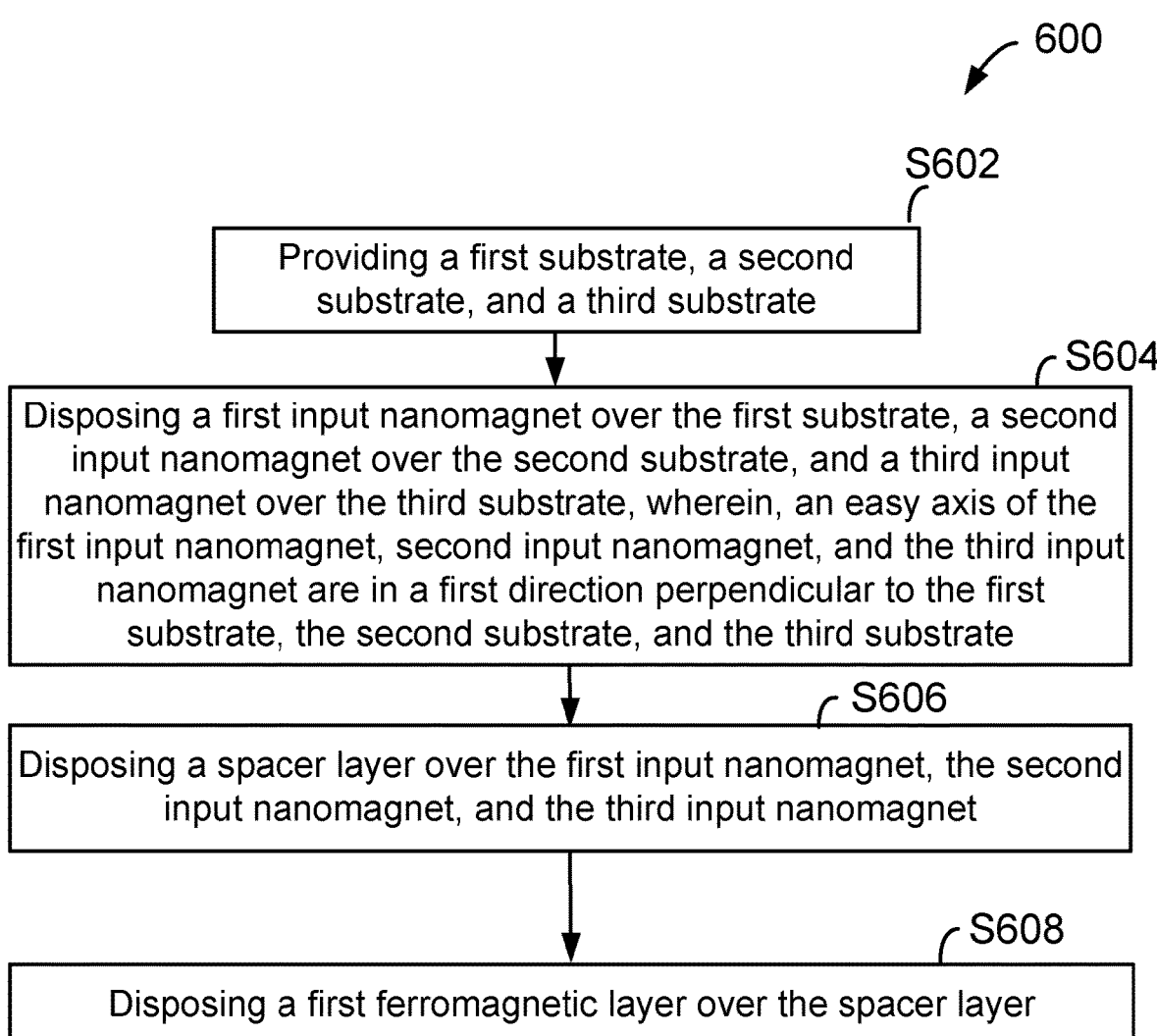

600

S602

Providing a first substrate, a second substrate, and a third substrate

S604

Disposing a first input nanomagnet over the first substrate, a second input nanomagnet over the second substrate, and a third input nanomagnet over the third substrate, wherein, an easy axis of the first input nanomagnet, second input nanomagnet, and the third input nanomagnet are in a first direction perpendicular to the first substrate, the second substrate, and the third substrate

S606

Disposing a spacer layer over the first input nanomagnet, the second input nanomagnet, and the third input nanomagnet

S608

Disposing a first ferromagnetic layer over the spacer layer

FIGURE 6

SYSTEM AND METHOD FOR NANOMAGNET BASED LOGIC DEVICE

RELATED APPLICATION

None

TECHNICAL FIELD

The present invention relates generally to logic devices and more specifically, to nanomagnet based logic devices.

DESCRIPTION OF RELATED ART

The complementary metal-oxide semiconductor (CMOS) technology based logic devices are reaching their physical limits in terms of reliability and power consumption in current day application. Further, continued requirement for minimal power consumption in computing devices configured to use these logic devices and utilization of semiconductor technology to construct these logic devices are desirable for mass adaptation of these devices. With these needs in mind, the current disclosure arises. This brief summary has been provided so that the nature of the disclosure may be understood quickly. A more complete understanding of the disclosure can be obtained by reference to the following detailed description of the various embodiments thereof in connection with the attached drawings.

SUMMARY OF THE INVENTION

In one embodiment, a method is disclosed. A first substrate, a second substrate and a third substrate is provided. A first input nanomagnet is disposed over the first substrate, a second input nanomagnet is disposed over the second substrate, and a third input nanomagnet is disposed over the third substrate. The easy axis of the first input nanomagnet, the second input nanomagnet, and the third input nanomagnet are in a first direction substantially perpendicular to the first substrate, the second substrate, and the third substrate respectively. A spacer layer is disposed over the first input nanomagnet, the second input nanomagnet, and the third input nanomagnet. A first ferromagnetic layer is disposed over the spacer layer.

In another embodiment, a logic device is disclosed. A first substrate, a second substrate and a third substrate is provided. A first input nanomagnet is disposed over the first substrate, a second input nanomagnet is disposed over the second substrate, and a third input nanomagnet is disposed over the third substrate. The easy axis of the first input nanomagnet, the second input nanomagnet, and the third input nanomagnet are in a first direction substantially perpendicular to the first substrate, the second substrate, and the third substrate respectively. A spacer layer is disposed over the first input nanomagnet, the second input nanomagnet, and the third input nanomagnet. A first ferromagnetic layer is disposed over the spacer layer.

This brief summary is provided so that the nature of the disclosure may be understood quickly. A more complete understanding of the disclosure can be obtained by reference to the following detailed description of the preferred embodiments thereof in connection with the attached drawings.

BRIEF DESCRIPTION OF THE DRAWINGS

The foregoing and other features of several embodiments are described with reference to the drawings. In the drawings, the same components have the same reference numerals. The illustrated embodiments are intended to illustrate but not limit the invention. The drawings include the following figures:

FIG. 6 shows an example flow diagram, according to one aspect of the present disclosure.

DETAILED DESCRIPTION

To facilitate an understanding of the adaptive aspects of the present disclosure, an example logic device will be described. The specific construction and operation of the adaptive aspects of various elements of the example logic device is also described.

Figure 1:
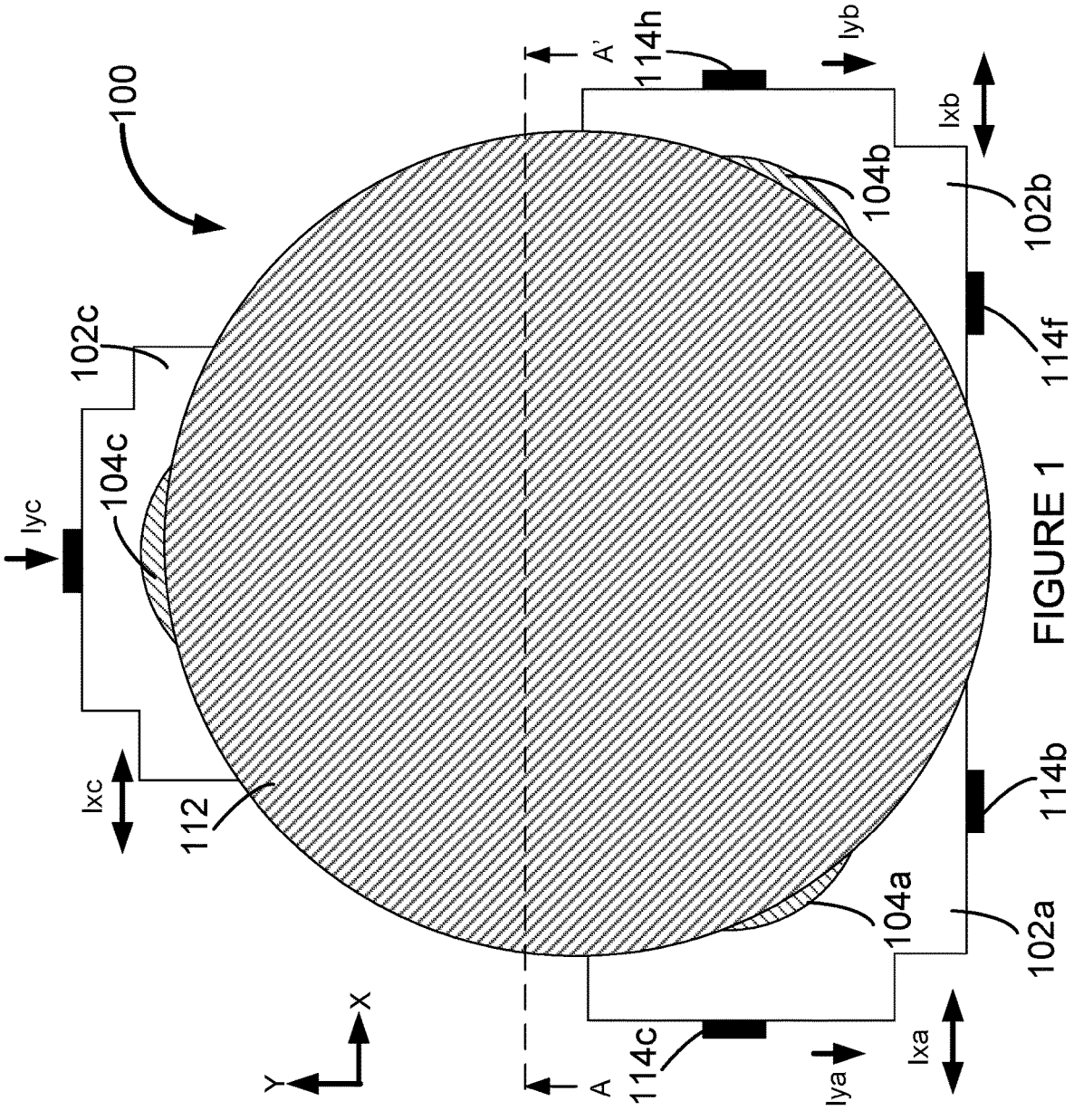
FIGS. 1 and 1A show an example logic device, according to one aspect of the present disclosure.
Figure 1A:
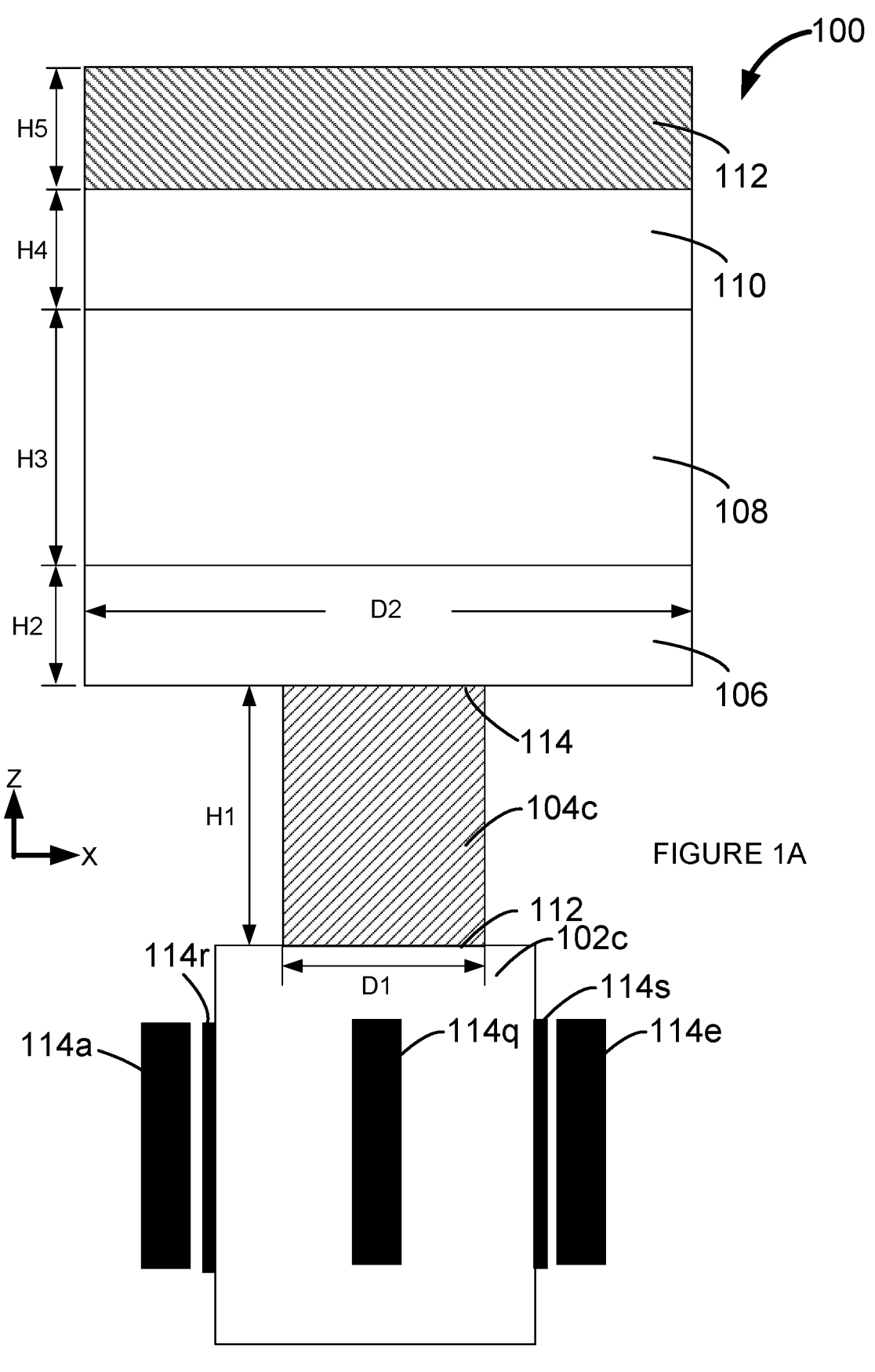

FIG. 1 shows a plan view of an example logic device 100. FIG. 1A shows a cross-sectional view of the logic device 100, along line A-A'. Now, referring to FIGS. 1 and 1A, the logic device 100 includes a first substrate 102a, a second substrate 102b, and third substrate 102c, a first input nanomagnet 104a, a second input nanomagnet 104b, and a third input nanomagnet 104c, a spacer layer 106, a first ferromagnetic layer 108, a barrier layer 110, and an output magnet 112. The first substrate 102a, second substrate 102b, and third substrate 102c are conductive metal layers. The first substrate 102a, second substrate 102b, and third substrate 102c are substantially made of heavy metal, such as an alloy of β-Tantalum (β-Ta), Platinum (Pt), or β-Tungsten (β-W) or an alloy of heavy metal. In one example, first substrate 102a, second substrate 102b, and third substrate 102c are each a layer of thin film with a very large spin hall angle, such as a layer of thin film of β-Tantalum (β-Ta), Platinum (Pt), or β-Tungsten (β-W) or an alloy of β-Tantalum (β-Ta), Platinum (Pt), or β-Tungsten (β-W). In one example, the first substrate 102a, the second substrate 102b, and the third substrate 102c are topological insulators.

The first substrate 102a, the second substrate 102b, and the third substrate 102c are configured to receive a charge current and convert the charge current into a spin current, through spin Hall effect. In some examples, the first substrate 102a, the second substrate 102b, and the third substrate 102c may be a topological insulator of one or more stacks of Cobalt/Platinum ((Co/Pt)n) exhibiting large charge to spin conversion ratio. The thickness of the first substrate 102a, the second substrate 102b, and the third substrate 102c may be of the order of about 5 nm to about 10 nm.

Figure 1B:
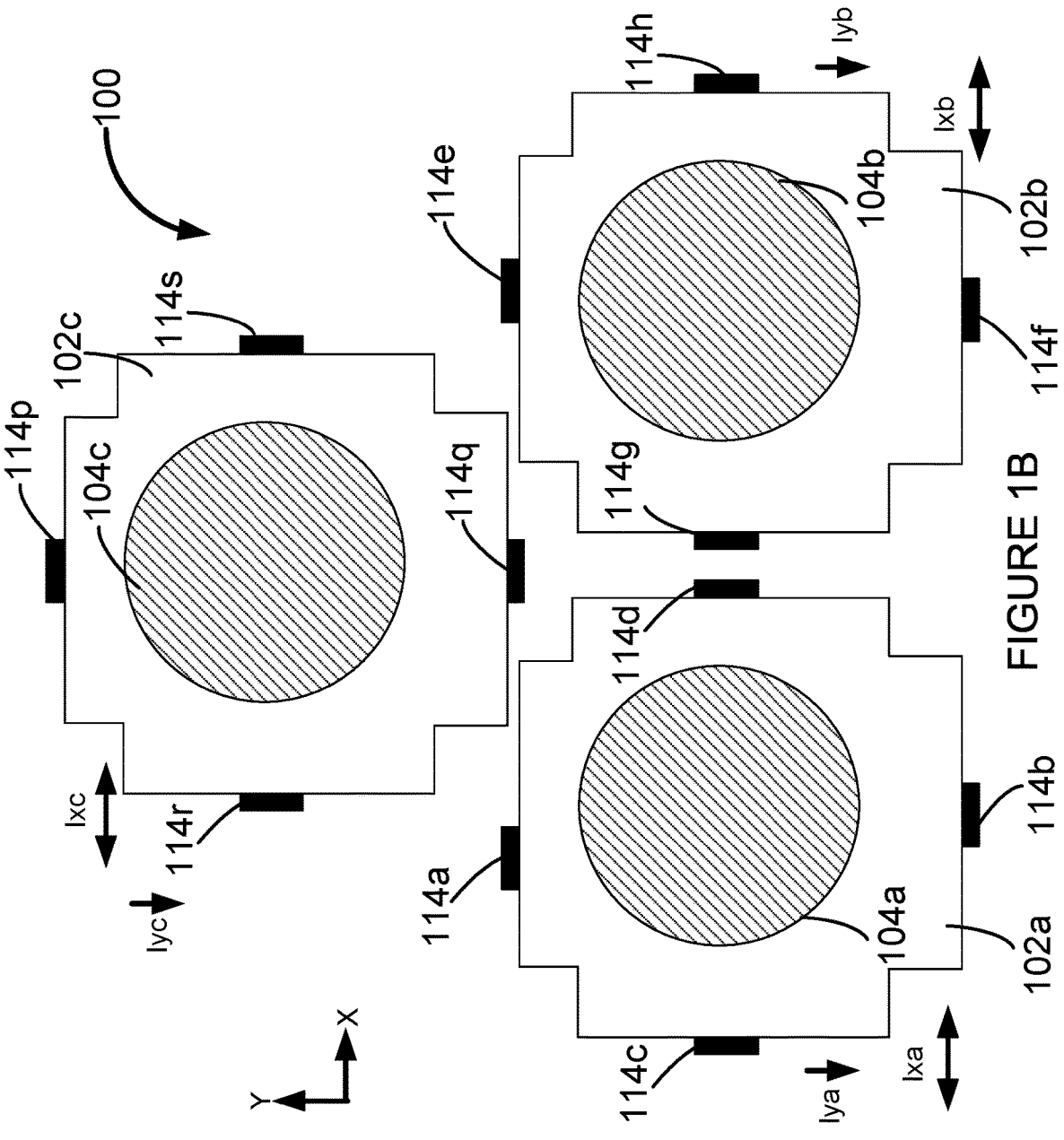
FIGS. 1B, and 1C show various elements of the logic device of FIG. 1, according to one aspect of the present disclosure.

Now, referring to FIG. 1B, the first substrate 102a includes a first pair of conductive pads 114a and 114b, and a second pair of conductive pads 114c and 114d. A first charge current Iy may be selectively passed through the first substrate 102a, using the first pair of conductive pads 114a and 114b. A second charge current Ix may be selectively passed through the first substrate 102a, using the second pair of conductive pads 114c and 114d. In one example, the first charge current Iy is passed along a Y axis and the second charge current Ix is passed along the X axis, perpendicular to the Y axis.

Similarly, the second substrate 102b includes a first pair of conductive pads 114e and 114f, and a second pair of conductive pads 114g and 114h. A first charge current Iy may be selectively passed through the second substrate 102b, using the first pair of conductive pads 114e and 114f. A second charge current Ix may be selectively passed through the second substrate 102b, using the second pair of conductive pads 114g and 114h. In one example, the first charge current Iy is passed along a Y axis and the second charge current Ix is passed along the X axis, perpendicular to the Y axis.

Similarly, the third substrate 102c includes a first pair of conductive pads 114p and 114q, and a second pair of conductive pads 114r and 114s. A first charge current Iy may be selectively passed through the third substrate 102c, using the first pair of conductive pads 114p and 114q. A second charge current Ix may be selectively passed through the third substrate 102c, using the second pair of conductive pads 114r and 114s. In one example, the first charge current Iy is passed along a Y axis and the second charge current Ix is passed along the X axis, perpendicular to the Y axis. Functions and features of the first charge current Iy and the second charge current Ix will be later described in detail. As one skilled in the art appreciates, the first substrate 102a, second substrate 102b, and the third substrate 102c may be deposited on a base layer (not shown). In some examples, base layer may be a silicon wafer.

The first input nanomagnet 104a is disposed over the first substrate 104a, the second input nanomagnet 104b is disposed over the second substrate 102b, and a third input nanomagnet 104c is disposed over the third substrate 102c. In one example, each of the first input nanomagnet 104a, the second input nanomagnet 104b, and the third input nanomagnet 104c are selectively disposed on the first substrate 102a, second substrate 102b, and third substrate 102c respectively, equidistant from each other.

The first input nanomagnet 104a is disposed over the substrate 102a, for example, along a Z axis, perpendicular to the X axis and Y axis. The first input nanomagnet 104a is substantially made of a permalloy, or cobalt-iron-boron (CoFeB) alloy. In one example, the first input nanomagnet 104a is substantially cylindrical, with a diameter D1 of about 2.5 nm to about 5 nm. The thickness H1 of the first input nanomagnet 104a along the Z axis may be higher than the diameter of the first input nanomagnet 104a. In some examples, the thickness H1 may be of the order of about 3 nm to about 6 nm. As one skilled in the art appreciates, the dimension of the first input nanomagnet 104a is such that the diameter D1 is less than the thickness H1, thereby providing a shape anisotropy, which will enhance effective anisotropy along Z axis. In other words, the easy axis of the first input nanomagnet 104a is along the Z axis and the hard axis of the first input nanomagnet 104a is along X axis (or Y axis). The first input nanomagnet 104a has a first end 112a abutting the substrate 102a and a second end 114a opposite to the first end 112a, away from the substrate 102a. The second end 114a of the first input nanomagnet 104a abuts the spacer layer 106.

In one example, the second input nanomagnet 104b, and the third input nanomagnet 104c are constructed substantially similar to the first input nanomagnet 104a. In one example, the first input nanomagnet 104a, the second input nanomagnet 104b, and the third input nanomagnet 104c are selectively disposed over the first substrate 102a, second substrate 102b, and third substrate 102c respectively, substantially at the vertex of an equilateral triangle 110. In one example, by selectively disposing the first input nanomagnet 104a, the second input nanomagnet 104b, and the third input nanomagnet 104c at the vertex of an equilateral triangle 110, all of the first input nanomagnet 104a, the second input nanomagnet 104b, and the third input nanomagnet 104c will have substantially equal contribution to the state of the output nanomagnet 108.

The first substrate 102a, second substrate 102b, and third substrate 102c are configured to receive a charge current and convert the charge current into a spin current, through spin Hall effect. For example, the first substrate 102a, the second substrate 102b, and the third substrate 102c are all configured to receive a first charge current Iy, and the second charge current Ix, using the first pair of conductive pads and second pair of conductive pads respectively, as previously described.

The dimensions of first substrate 102a, second substrate 102b, and third substrate 102c may be selected so as to have a first charge current density Jy for the first charge current Iy of about 5e10 Amperes/meter$^2$, and a second charge current density Jx for the second charge current Ix of about 5e9 Amperes/meter$^2$, through each of the first substrate 102a, second substrate 102b, and third substrate 102c. As one skilled in the art appreciates, the first substrate 102a, second substrate 102b, and third substrate 102c may be deposited on a base layer (not shown). In some examples, base layer may be a silicon wafer.

Figure 1C:
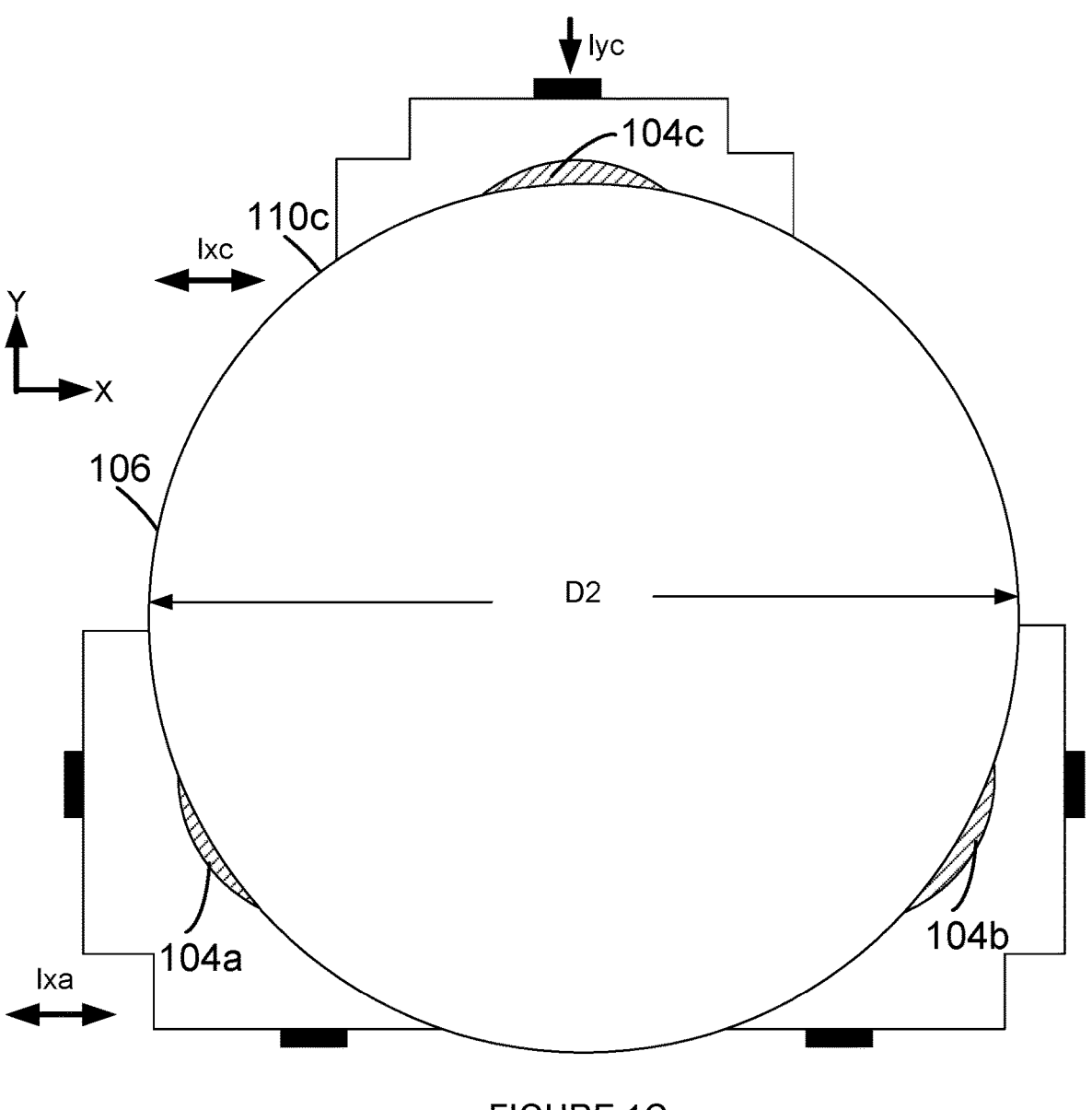

Now, referring to FIG. 1C, the spacer layer 106 is selectively disposed over the first input nanomagnet 104a, second input nanomagnet 104b, and third input nanomagnet 104c, to substantially cover the first input nanomagnet 104a, second input nanomagnet 104b, and third input nanomagnet 104c. The spacer layer 106 is made of a non-magnetic material. The diameter D2 of the spacer layer 106 is about 10 nm.

Now, referring back to FIGS. 1 and 1A, the first ferromagnetic layer 108 is selectively disposed over the spacer layer 106. A thickness H2 of the spacer layer 106 may be of the order of about 1 nm to about 2 nm. In one example, the first ferromagnetic layer 108 is selectively positioned over the space layer 106 such that the first ferromagnetic layer 108 is subjected to substantially equal effect from the first input magnet 104a, second input magnet 104b, and third input magnet 104c. In one example, the first ferromagnetic layer 108 is substantially cylindrical, with a diameter D2 of about 10 nm. A thickness H3 of the first ferromagnetic layer 108 is about 1 nm. In one example, the dimensions and construction of the first ferromagnetic layer 108 is such that it performs as a single domain nanomagnet.

A barrier layer 110 is disposed over the first ferromagnetic layer 108. The barrier layer 110 in one example, is substantially made of an insulating tunneling barrier material, for example, Magnesium Oxide (MgO). A thickness H4 of the barrier layer 110 may be of the order of about 0.5 nm to about 1 nm. The diameter of the barrier layer 110 may be substantially similar to the diameter of the first ferromagnetic layer 108. In one example, the barrier layer 110 is substantially cylindrical, with a diameter D of about 10 nm. In one example, the barrier layer 110 causes the magnetic orientation to be perpendicular (in +Z or –Z axis) in the first ferromagnetic layer 108. The output magnet 112 is disposed over the barrier layer 110. In one example, the output magnet 112 is substantially cylindrical, with a diameter D of about 10 nm. A thickness H5 of the output magnet 112 may be of the order of about 1 nm to about 2 nm. The barrier layer 110 causes the magnetization of the output magnet 112 to be oriented in perpendicular direction, either in +Z axis or –Z axis. The magnetic orientation of the output magnet 112 is defined by the magnetic orientation of the first ferromagnetic layer 108, in the same direction as the magnetic orientation of the first ferromagnetic layer 108. In one example, the magnetic orientation in the output magnet 112 will be same as the magnetic orientation in the first ferromagnetic layer 110, due to ferromagnetic coupling.

Having generally described the construction of the logic device 100, example general operation of the logic device 100 will now be described, with reference to FIG. 1. The orientation of the magnetic domain of each of the first input nanomagnet 104a, second input nanomagnet 104b, and third input nanomagnet 104c are selectively set by first passing the first charge current Iy and then passing the second charge current Ix, through the first substrate 102a, the second substrate 102b, and the third substrate 102c, respectively. For example, first charge current Iya and second charge current Ixa are passed through the first substrate 102a. Similarly, first charge current Iyb and second charge current Ixb are passed through the second substrate 102b. Similarly, first charge current Iyc and second charge current Ixc are passed through the third substrate 102c.

As previously described, in one example, the first charge current Iy is passed along the Y axis. The first charge current Iy sets the orientation of magnetization in the first input nanomagnet 104a, second input nanomagnet 104b, and the third input nanomagnet 104c along X direction. Based on the shape anisotropy as previously described, X axis corresponds to the hard axis of the first input nanomagnet 104a, second input nanomagnet 104b, and the third input nanomagnet 104c. Thereafter, the second charge current Ix is passed along the X axis. The second charge current Ix sets the orientation of magnetization in the first input nanomagnet 104a, second input nanomagnet 104b, and the third input nanomagnet 104c along either +Z direction or –Z direction, based on the direction of the second charge current Ix. Based on the shape anisotropy as previously described, Z axis corresponds to the easy axis of the first input nanomagnet 104a, second input nanomagnet 104b, and the third input nanomagnet 104c. In one example, the direction of orientation of the magnetization of the first input nanomagnet 104a, second input nanomagnet 104b, and the third input nanomagnet 104c along the Z axis defines a first value and a second value. In one example, direction of orientation along +Z axis may correspond to the first value and the direction of orientation along –Z axis may correspond to the second value. In one example, the first value may indicate a logical value of 0 and the second value may indicate a logical value of 1.

The state of the first input nanomagnet 104a, second input nanomagnet 104b, and third input nanomagnet 104c is selectively set based on the input values to the logic device 100. The resultant magnetic orientation of the first input nanomagnet 104a, second nanomagnet 104b, and the third nanomagnet 104c gets antiferromagnetically exchange coupled to the first ferromagnetic layer 108, through the spacer layer 106.

In one example, the first ferromagnetic layer 108 is a single domain nanomagnet, the majority of the state of the first input nanomagnet 104a, second input nanomagnet 104b, and the third input nanomagnet 104c determine the state of the first ferromagnetic layer 108.

Figure 1D:
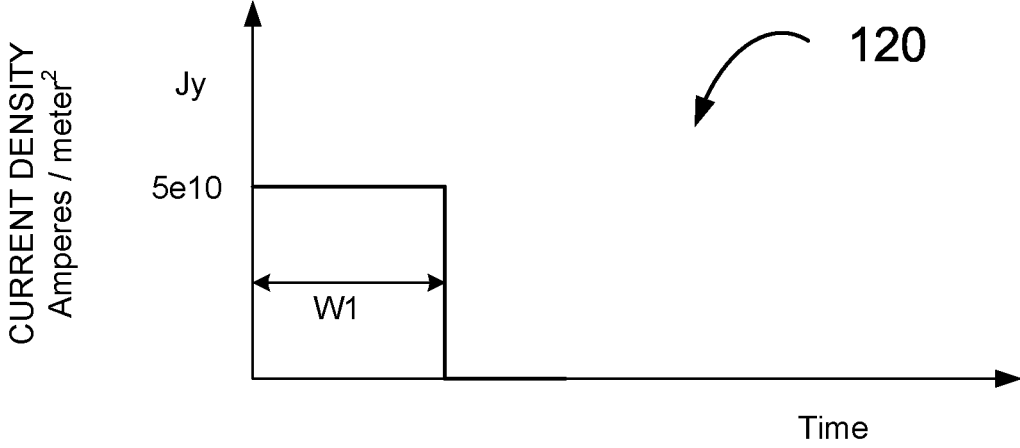
FIGS. 1D, 1E show example graph of the first charge current density and the second charge current density respectively, according to one aspect of the present disclosure.

In one example, the current density Jy for first charge current Iy may be of the order of about 5e10 Amperes/meter$^2$. Corresponding amplitude of the first charge current Iy is determined based on the dimension of the substrate 102. Further, the pulse width W1 may be of the order of about 1-10 nanoseconds. FIG. 1D shows graph 120 depicting an example current density Jy of the first charge current pulse Iy.

Figure 1E:
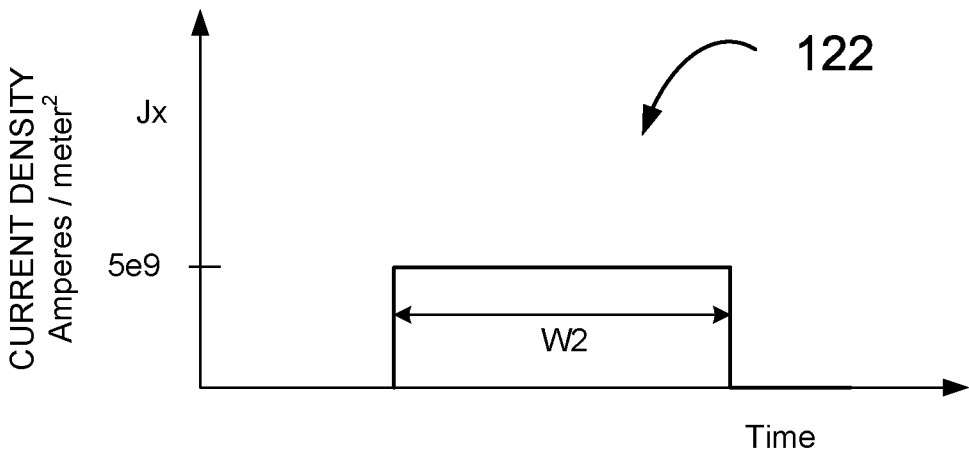

After orienting the magnetic domains of the first input nanomagnet 104a, second nanomagnet 104b, and the third nanomagnet 104c along the hard axis, second charge current Ix is passed through the substrate, along +X or –X axis, based on the input value (either the first value or the second value) to be stored in the device 100. In one example, the current density Jx for second charge current Ix may be of the order of about 5e9 Amperes/meter$^2$. In one example, corresponding amplitude of the second charge current Ix is determined based on the dimension of the substrate 102. Further, in one example, the pulse width W2 of the second charge current Ix may be of the order of about 1-10 nanoseconds. FIG. 1E shows graph 122 depicting an example current density of the second charge current pulse Ix. As one skilled in the art appreciates, the second charge current Ix is significantly less than the first charge current Iy, as switching the magnetic domains along the easy axis requires less current than switching the magnetic domain along the hard axis.

Having described the general operation of the logic device, various interactions due to different magnetic domain polarization of the first input nanomagnet 104a, second nanomagnet 104b, and the third nanomagnet 104c is now explained.

FIGS. 2A, 2B, 2C, and 2D represent an example implementation of a NAND logic. In this example, the direction of one of the charge currents, for example, the first charge current ICa is selected to indicate a value of 0, and the direction of the other charge currents, for example, direction of second charge current ICb, and third charge current ICc are selectively changed to set various inputs to the logic device, and getting corresponding outputs indicative of a NAND logic.

Figure 2A:
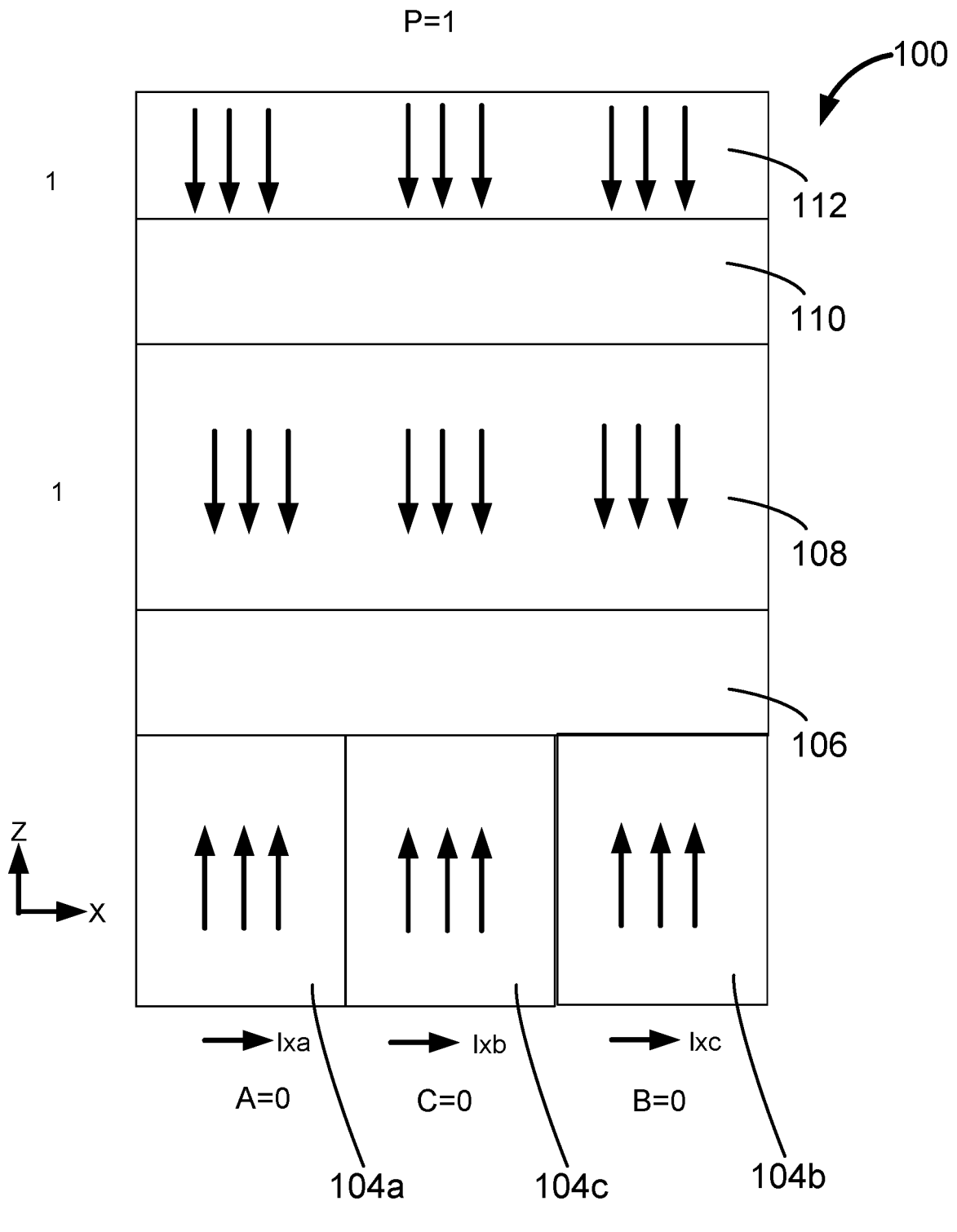
FIGS. 2A, 2B, 2C, and 2D show various inputs and corresponding output states of the logic device implementing a NAND logic, according to one aspect of the present disclosure.

Now, referring to FIG. 2A, first input nanomagnet 104a, second nanomagnet 104b, the third nanomagnet 104c, spacer layer 106, first ferromagnetic layer 108, barrier layer 110, and output magnet 112 are shown. In this example, the direction of second charge current Ixa is selected to indicate a value of A=0, which is shown with magnetic spins pointing upwards in the first input nanomagnet 104a. This will generate an antiferromagnetic state with the spins pointing downwards in the first ferromagnetic layer 108. Similarly, the direction of second charge current Ixb is selected to indicate a value of B=0, which is shown with magnetic spins pointing upwards in the second input nanomagnet 104b. This will generate an antiferromagnetic state with the spins pointing downwards in the first ferromagnetic layer 108. Similarly, the direction of third charge current Ixc is selected to indicate a value of C=0, which is shown with magnetic spins pointing upwards in the third input nanomagnet 104c. This will generate an antiferromagnetic state with the spins pointing downwards in the first ferromagnetic layer 108. Based on the direction of magnetic spins in the first ferromagnetic layer 108 will together result in a total magnetic spin pointing downwards. As the first ferromagnetic layer 108 is a single domain nanomagnet, the majority of the state of the first input nanomagnet 104*a*, second input nanomagnet 104*b*, and the third input nanomagnet 104*c* determine the state of the first ferromagnetic layer 108. As the magnetic spin pointing upwards was indicative of a value of 0, the magnetic spin pointing downwards will indicate a value of 1. In other words, in this example, the input to the logic device due to second input nanomagnet 102*b* and third input nanomagnet 102*c* was {0,0} and the output was P={1}. As one skilled in the art appreciates, this is indicative of a NAND operation. As previously described, the magnetic orientation of the output magnet 112 is defined by the magnetic orientation of the first ferromagnetic layer 108, in the same direction as the magnetic orientation of the first ferromagnetic layer 108, due to ferromagnetic coupling. In other words, in this example, the orientation of the output magnet 112 will be in the −Z direction, indicating a value of {1}, which is same as the output P.

Figure 2B:
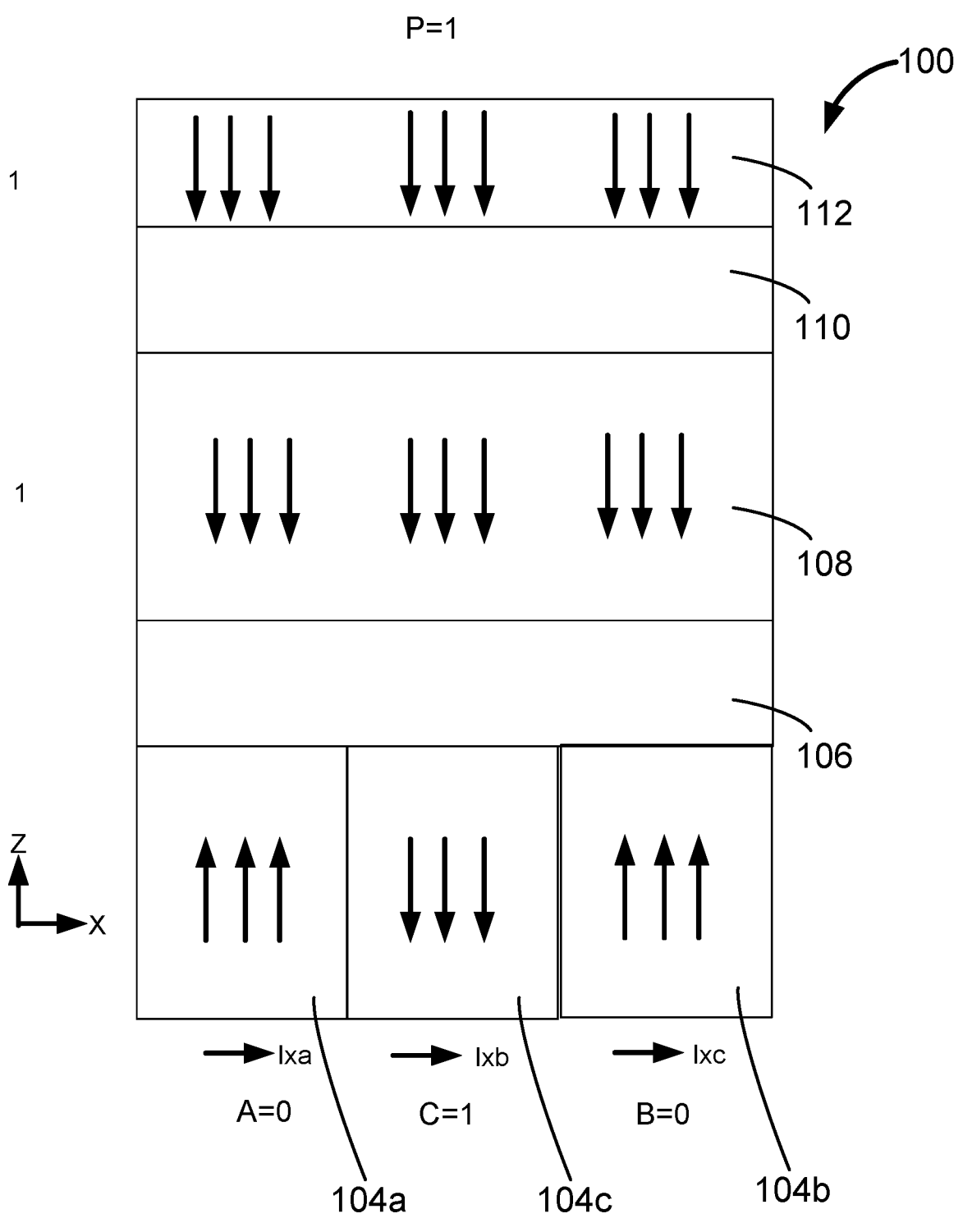

Now, referring to FIG. 2B, first input nanomagnet 104*a*, second nanomagnet 104*b*, the third nanomagnet 104*c*, spacer layer 106, first ferromagnetic layer 108, barrier layer 110, and output magnet 112 are shown. In this example, the direction of second charge current Ixa is selected to indicate a value of A=0, which is shown with magnetic spins pointing upwards in the first input nanomagnet 104*a*. This will generate an antiferromagnetic state with the spins pointing downwards in the first ferromagnetic layer 108. Similarly, the direction of second charge current Ixb is selected to indicate a value of B=0, which is shown with magnetic spins pointing upwards in the second input nanomagnet 104*b*. This will generate an antiferromagnetic state with the spins pointing downwards in the first ferromagnetic layer 108. However, the direction of third charge current Ixc is selected to indicate a value of C=1, which is shown with magnetic spins pointing downwards in the third input nanomagnet 104*c*. This will generate an antiferromagnetic state with the spins pointing upwards in the first ferromagnetic layer 108. Based on the direction of magnetic spins in the first ferromagnetic layer 108 will together result in a total magnetic spin pointing downwards. As the first ferromagnetic layer 108 is a single domain nanomagnet, the majority of the state of the first input nanomagnet 104*a*, second input nanomagnet 104*b*, and the third input nanomagnet 104*c* determine the state of the first ferromagnetic layer 108. As the magnetic spin pointing upwards was indicative of a value of 0, the magnetic spin pointing downwards will indicate a value of 1. In other words, in this example, the input to the logic device due to second input nanomagnet 102*b* and third input nanomagnet 102*c* was {0,1} and the output was P={1}. As one skilled in the art appreciates, this is indicative of a NAND operation. As previously described, the magnetic orientation of the output magnet 112 is defined by the magnetic orientation of the first ferromagnetic layer 108, in the same direction as the magnetic orientation of the first ferromagnetic layer 108, due to ferromagnetic coupling. In other words, in this example, the orientation of the output magnet 112 will be in the −Z direction, indicating a value of {1}, which is the same as the output P.

Figure 2C:
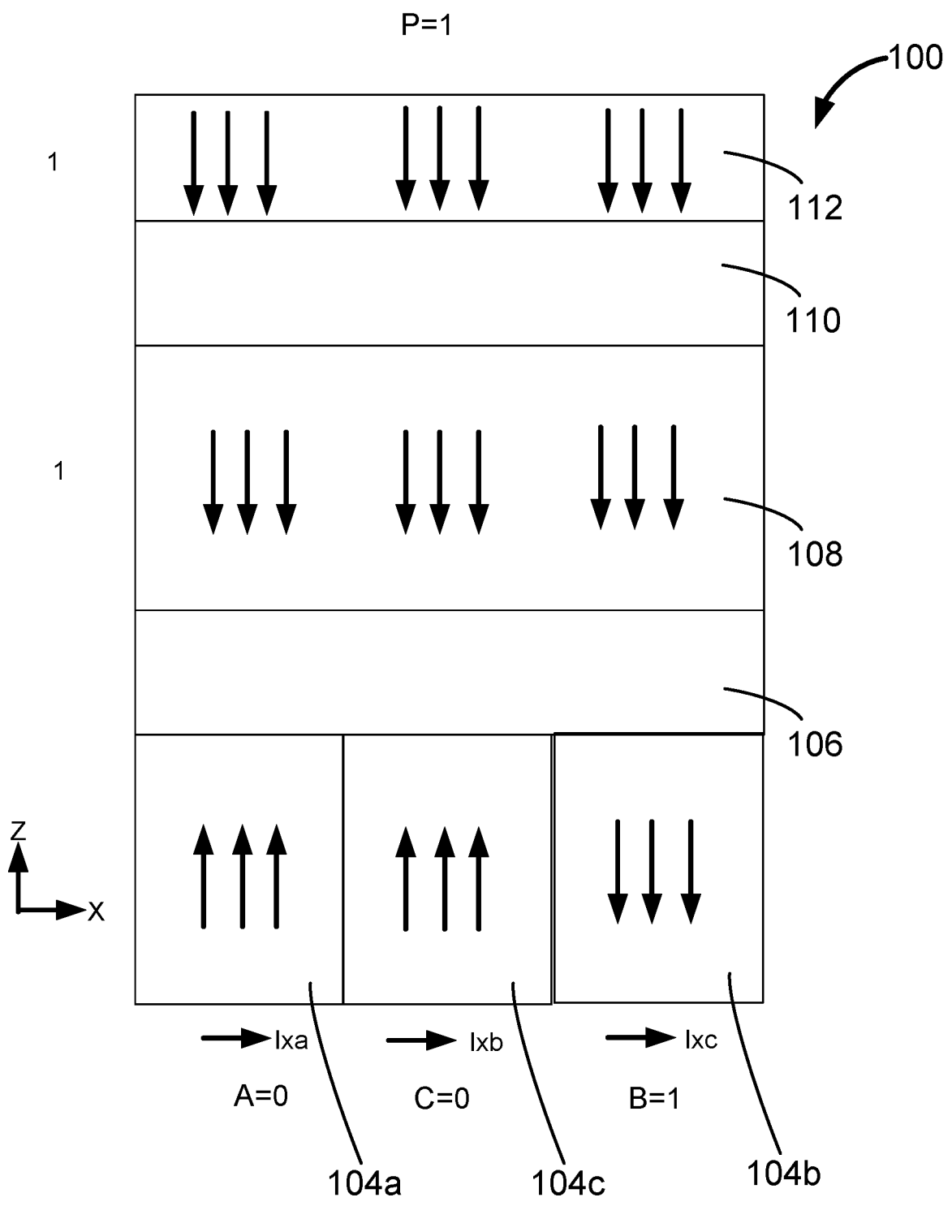

Now, referring to FIG. 2C, first input nanomagnet 104*a*, second nanomagnet 104*b*, the third nanomagnet 104*c*, spacer layer 106, first ferromagnetic layer 108, barrier layer 110, and output magnet 112 are shown. In this example, the direction of second charge current Ixa is selected to indicate a value of A=0, which is shown with magnetic spins pointing upwards in the first input nanomagnet 104*a*. This will generate an antiferromagnetic state with the spins pointing downwards in the first ferromagnetic layer 108. The direction of second charge current Ixb is selected to indicate a value of B=1, which is shown with magnetic spins pointing downwards in the second input nanomagnet 104*b*. This will generate an antiferromagnetic state with the spins pointing upwards in the first ferromagnetic layer 108. However, the direction of third charge current Ixc is selected to indicate a value of C=0, which is shown with magnetic spins pointing upwards in the third input nanomagnet 104*c*. This will generate an antiferromagnetic state with the spins pointing downwards in the first ferromagnetic layer 108. Based on the direction of magnetic spins in the first ferromagnetic layer 108 will together result in a total magnetic spin pointing downwards. As the first ferromagnetic layer 108 is a single domain nanomagnet, the majority of the state of the first input nanomagnet 104*a*, second input nanomagnet 104*b*, and the third input nanomagnet 104*c* determine the state of the first ferromagnetic layer 108. As the magnetic spin pointing upwards was indicative of a value of 0, the magnetic spin pointing downwards will indicate a value of 1. In other words, in this example, the input to the logic device due to second input nanomagnet 102*b* and third input nanomagnet 102*c* was {1,0} and the output was P={1}. As one skilled in the art appreciates, this is indicative of a NAND operation. As previously described, the magnetic orientation of the output magnet 112 is defined by the magnetic orientation of the first ferromagnetic layer 108, in the same direction as the magnetic orientation of the first ferromagnetic layer 108, due to ferromagnetic coupling. In other words, in this example, the orientation of the output magnet 112 will be in the −Z direction, indicating a value of {1}, which is same as the output P.

Figure 2D:
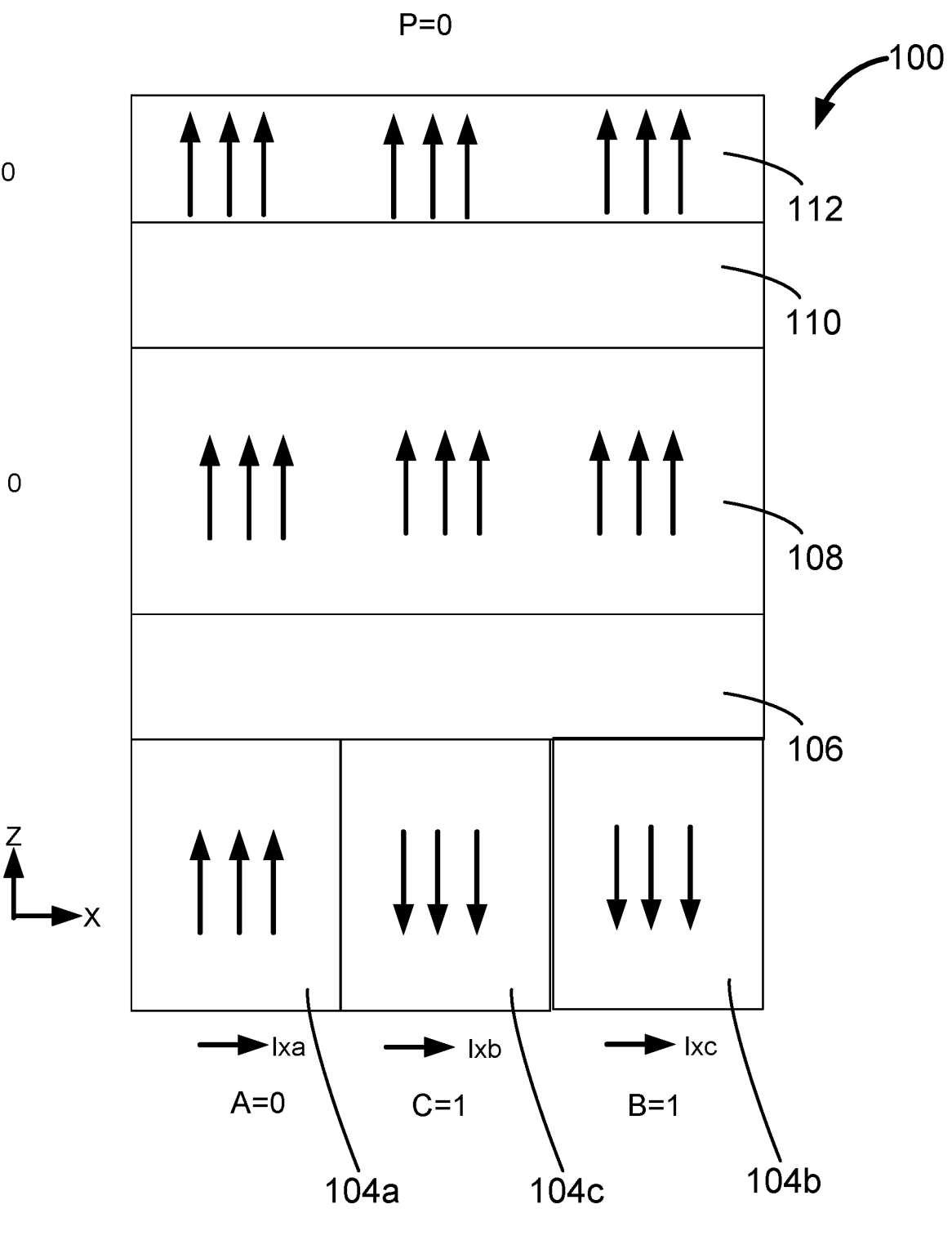

Now, referring to FIG. 2D, first input nanomagnet 104*a*, second nanomagnet 104*b*, the third nanomagnet 104*c*, spacer layer 106, first ferromagnetic layer 108, barrier layer 110, and output magnet 112 are shown. In this example, the direction of second charge current Ixa is selected to indicate a value of A=0, which is shown with magnetic spins pointing upwards in the first input nanomagnet 104*a*. This will generate an antiferromagnetic state with the spins pointing downwards in the first ferromagnetic layer 108. The direction of second charge current Ixb is selected to indicate a value of B=1, which is shown with magnetic spins pointing downwards in the second input nanomagnet 104*b*. This will generate an antiferromagnetic state with the spins pointing upwards in the first ferromagnetic layer 108. Further, the direction of third charge current Ixc is selected to indicate a value of C=1, which is shown with magnetic spins pointing downwards in the third input nanomagnet 104*c*. This will generate an antiferromagnetic state with the spins pointing upwards in the first ferromagnetic layer 108. Based on the direction of magnetic spins in the first ferromagnetic layer 108 will together result in a total magnetic spin pointing upwards. As the first ferromagnetic layer 108 is a single domain nanomagnet, the majority of the state of the first input nanomagnet 104*a*, second input nanomagnet 104*b*, and the third input nanomagnet 104*c* determine the state of the first ferromagnetic layer 108. As previously indicated, the magnetic spin pointing upwards is indicative of a value of 0. In other words, in this example, the input to the logic device due to second input nanomagnet 102*b* and third input nanomagnet 102*c* was {1,1} and the output was P={0}. As one skilled in the art appreciates, this is indicative of a NAND operation. As previously described, the magnetic orientation of the output magnet 112 is defined by the magnetic orientation of the first ferromagnetic layer 108, in the same direction as the magnetic orientation of the first ferromagnetic layer 108, due to ferromagnetic coupling. In other words, in this example, the orientation of the output magnet 112 will be in the +Z direction, indicating a value of {0}, which is same as the output P.

FIGS. 3A, 3B, 3C, and 3D represent an example implementation of a NOR logic. In this example, the direction of one of the second charge currents, for example, the second charge current Ixa is selected to indicate a value of 1, and the direction of the other second charge charge currents, for example, direction of second charge current Ixb, and second charge current Ixc are selectively changed to set various inputs to the logic device, and getting corresponding outputs indicative of a NOR logic.

Figure 3A:
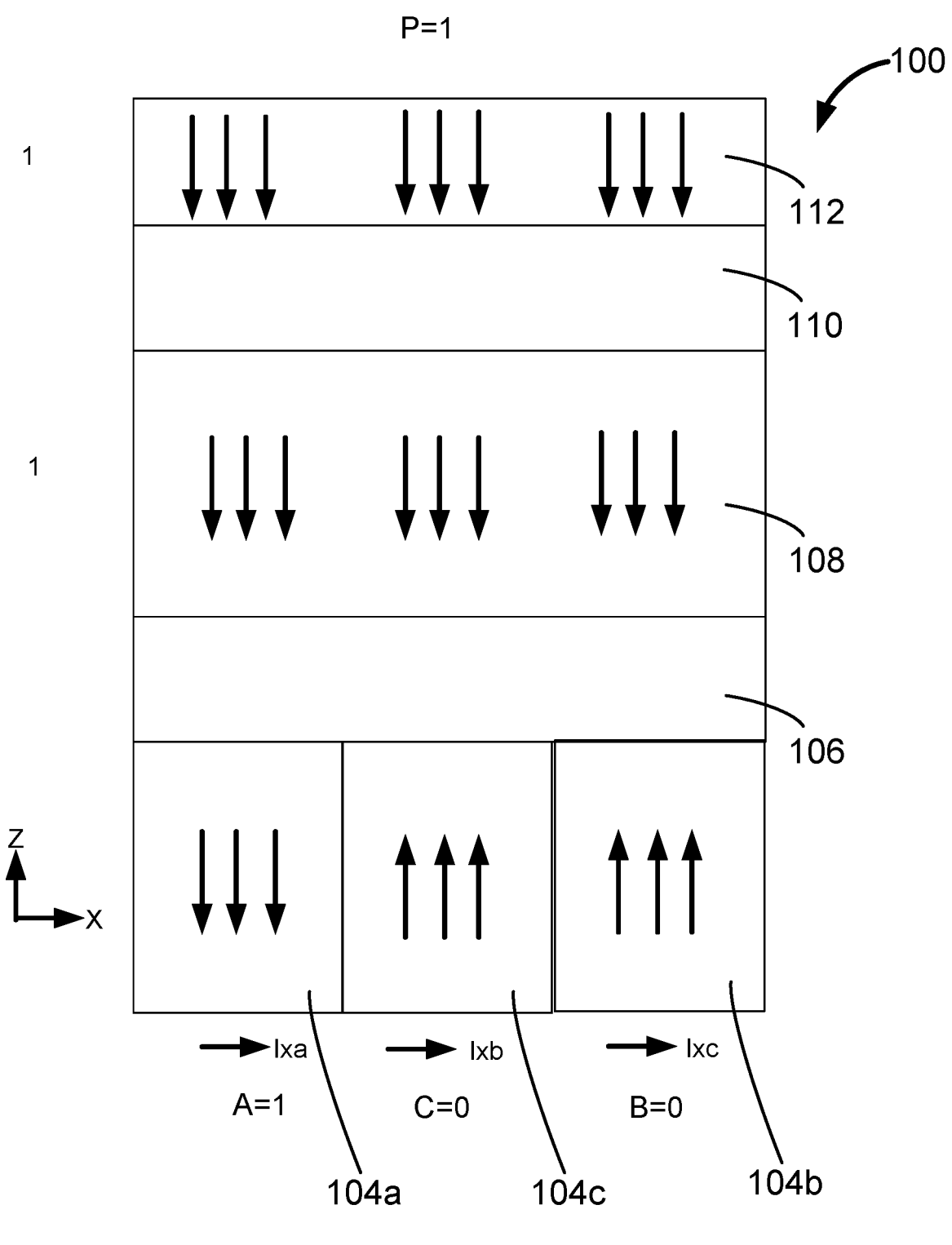
FIGS. 3A, 3B, 3C, and 3D show various inputs and corresponding output states of the logic device implementing a NOR logic, according to one aspect of the present disclosure.

Now, referring to FIG. 3A, first input nanomagnet 104a, second nanomagnet 104b, the third nanomagnet 104c, spacer layer 106, first ferromagnetic layer 108, barrier layer 110, and output magnet 112 are shown. In this example, the direction of second charge current Ixa is selected to indicate a value of A=1, which is shown with magnetic spins pointing downwards in the first input nanomagnet 104a. This will generate an antiferromagnetic state with the spins pointing upwards in the first ferromagnetic layer 108. Similarly, the direction of second charge current Ixb is selected to indicate a value of B=0, which is shown with magnetic spins pointing upwards in the second input nanomagnet 104b. This will generate an antiferromagnetic state with the spins pointing downwards in the first ferromagnetic layer 108. Similarly, the direction of third charge current Ixc is selected to indicate a value of C=0, which is shown with magnetic spins pointing upwards in the third input nanomagnet 104c. This will generate an antiferromagnetic state with the spins pointing downwards in the first ferromagnetic layer 108. Based on the direction of magnetic spins in the first ferromagnetic layer 108 will together result in a total magnetic spin pointing downwards. As the first ferromagnetic layer 108 is a single domain nanomagnet, the majority of the state of the first input nanomagnet 104a, second input nanomagnet 104b, and the third input nanomagnet 104c determine the state of the first ferromagnetic layer 108. As the magnetic spin pointing upwards was indicative of a value of 0, the magnetic spin pointing downwards will indicate a value of 1. In other words, in this example, the input to the logic device due to second input nanomagnet 102b and third input nanomagnet 102c was {0,0} and the output was P={1}. As one skilled in the art appreciates, this is indicative of a NOR operation. As previously described, the magnetic orientation of the output magnet 112 is defined by the magnetic orientation of the first ferromagnetic layer 108, in the same direction as the magnetic orientation of the first ferromagnetic layer 108, due to ferromagnetic coupling. In other words, in this example, the orientation of the output magnet 112 will be in the −Z direction, indicating a value of {1}, which is same as the output P.

Figure 3B:
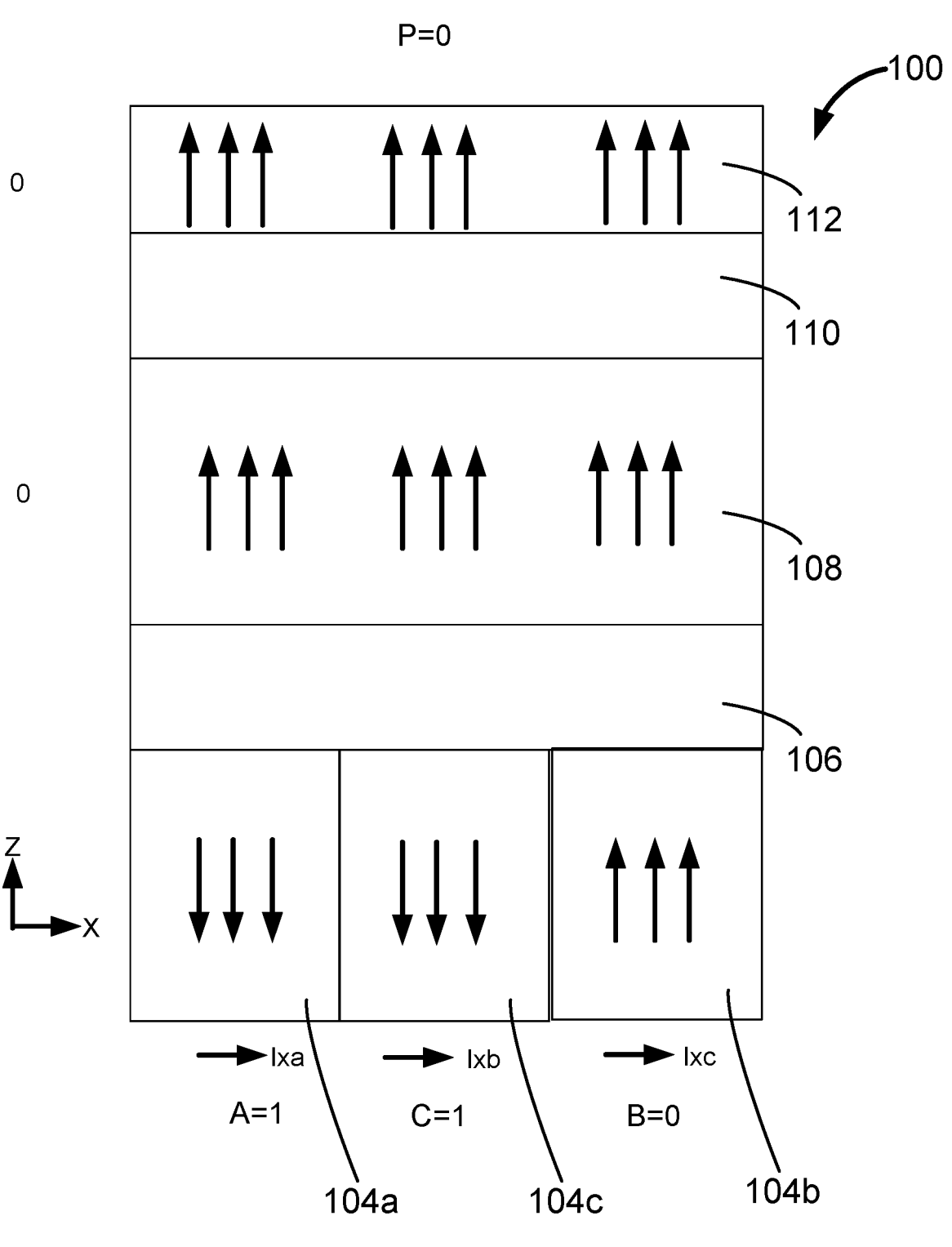

Now, referring to FIG. 3B, first input nanomagnet 104a, second nanomagnet 104b, the third nanomagnet 104c, spacer layer 106, first ferromagnetic layer 108, barrier layer 110, and output magnet 112 are shown. In this example, the direction of second charge current Ixa is selected to indicate a value of A=1, which is shown with magnetic spins pointing downwards in the first input nanomagnet 104a. This will generate an antiferromagnetic state with the spins pointing upwards in the first ferromagnetic layer 108. The direction of second charge current Ixb is selected to indicate a value of B=0, which is shown with magnetic spins pointing upwards in the second input nanomagnet 104b. This will generate an antiferromagnetic state with the spins pointing downwards in the first ferromagnetic layer 108. However, the direction of third charge current Ixc is selected to indicate a value of C=1, which is shown with magnetic spins pointing downwards in the third input nanomagnet 104c. This will generate an antiferromagnetic state with the spins pointing upwards in the first ferromagnetic layer 108. Based on the direction of magnetic spins in the first ferromagnetic layer 108 will together result in a total magnetic spin pointing upwards. As the first ferromagnetic layer 108 is a single domain nanomagnet, the majority of the state of the first input nanomagnet 104a, second input nanomagnet 104b, and the third input nanomagnet 104c determine the state of the first ferromagnetic layer 108. And, the magnetic spin pointing upwards is indicative of a value of 0. In other words, in this example, the input to the logic device due to second input nanomagnet 102b and third input nanomagnet 102c was {0,1} and the output was P={0}. As one skilled in the art appreciates, this is indicative of a NOR operation. As previously described, the magnetic orientation of the output magnet 112 is defined by the magnetic orientation of the first ferromagnetic layer 108, in the same direction as the magnetic orientation of the first ferromagnetic layer 108, due to ferromagnetic coupling. In other words, in this example, the orientation of the output magnet 112 will be in the −Z direction, indicating a value of {0}, which is the same as the output P.

Figure 3C:
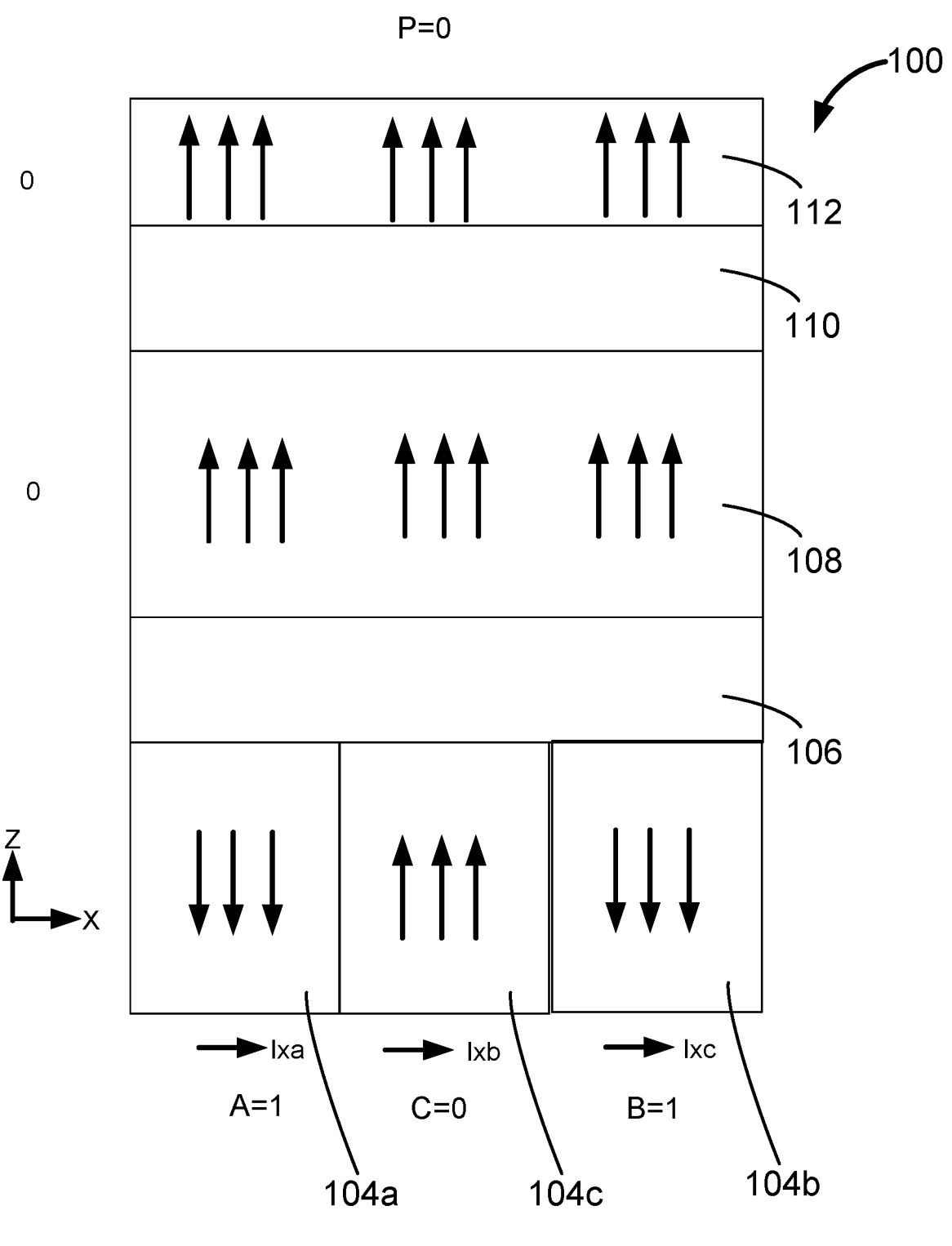

Now, referring to FIG. 3C, first input nanomagnet 104a, second nanomagnet 104b, the third nanomagnet 104c, spacer layer 106, first ferromagnetic layer 108, barrier layer 110, and output magnet 112 are shown. In this example, the direction of second charge current Ixa is selected to indicate a value of A=1, which is shown with magnetic spins pointing downwards in the first input nanomagnet 104a. This will generate an antiferromagnetic state with the spins pointing upwards in the first ferromagnetic layer 108. The direction of second charge current Ixb is selected to indicate a value of B=1, which is shown with magnetic spins pointing downwards in the second input nanomagnet 104b. This will generate an antiferromagnetic state with the spins pointing upwards in the first ferromagnetic layer 108. However, the direction of third charge current Ixc is selected to indicate a value of C=0, which is shown with magnetic spins pointing upwards in the third input nanomagnet 104c. This will generate an antiferromagnetic state with the spins pointing downwards in the first ferromagnetic layer 108. Based on the direction of magnetic spins in the first ferromagnetic layer 108 will together result in a total magnetic spin pointing upwards. As the first ferromagnetic layer 108 is a single domain nanomagnet, the majority of the state of the first input nanomagnet 104a, second input nanomagnet 104b, and the third input nanomagnet 104c determine the state of the first ferromagnetic layer 108. And, the magnetic spin pointing upwards is indicative of a value of 0. In other words, in this example, the input to the logic device due to second input nanomagnet 102b and third input nanomagnet 102c was {1,0} and the output was P={0}. As one skilled in the art appreciates, this is indicative of a NOR operation. As previously described, the magnetic orientation of the output magnet 112 is defined by the magnetic orientation of the first ferromagnetic layer 108, in the same direction as the magnetic orientation of the first ferromagnetic layer 108, due to ferromagnetic coupling. In other words, in this example, the orientation of the output magnet 112 will be in the −Z direction, indicating a value of {0}, which is same as the output P.

Figure 3D:
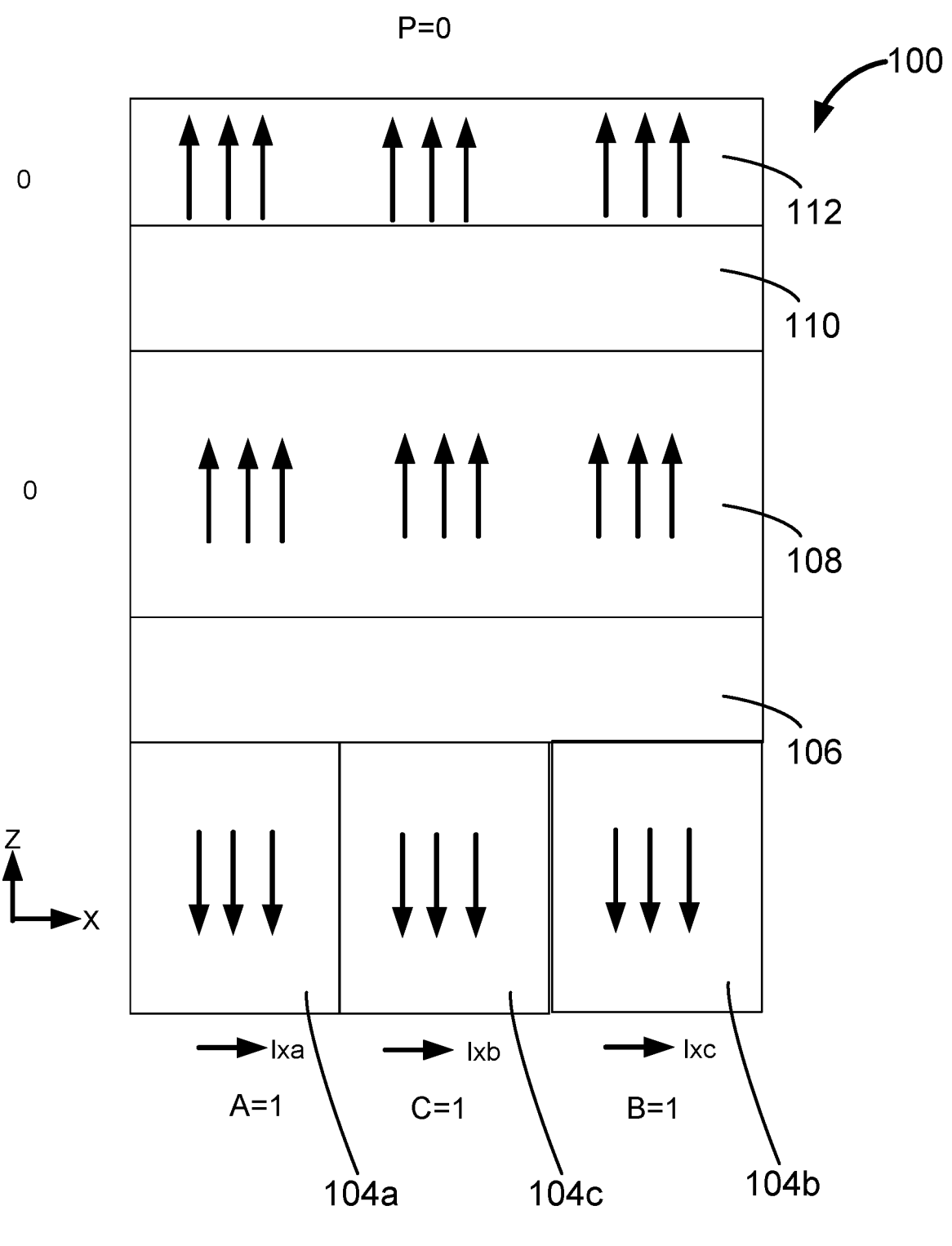

Now, referring to FIG. 3D, first input nanomagnet 104a, second nanomagnet 104b, the third nanomagnet 104c, spacer layer 106, first ferromagnetic layer 108, barrier layer 110, and output magnet 112 are shown. In this example, the direction of second charge current Ixa is selected to indicate a value of A=1, which is shown with magnetic spins pointing downwards in the first input nanomagnet 104a. This will generate an antiferromagnetic state with the spins pointing upwards in the first ferromagnetic layer 108. The direction of second charge current Ixb is selected to indicate a value of B=1, which is shown with magnetic spins pointing downwards in the second input nanomagnet 104b. This will generate an antiferromagnetic state with the spins pointing upwards in the first ferromagnetic layer 108. And, the direction of third charge current Ixc is selected to indicate a value of C=1, which is shown with magnetic spins pointing downwards in the third input nanomagnet 104c. This will generate an antiferromagnetic state with the spins pointing upwards in the first ferromagnetic layer 108. Based on the direction of magnetic spins in the first ferromagnetic layer 108 will together result in a total magnetic spin pointing upwards. As the first ferromagnetic layer 108 is a single domain nanomagnet, the majority of the state of the first input nanomagnet 104a, second input nanomagnet 104b, and the third input nanomagnet 104c determine the state of the first ferromagnetic layer 108. And, the magnetic spin pointing upwards is indicative of a value of 0. In other words, in this example, the input to the logic device due to second input nanomagnet 102b and third input nanomagnet 102c was {1,1} and the output was P={0}. As one skilled in the art appreciates, this is indicative of a NOR operation. As previously described, the magnetic orientation of the output magnet 112 is defined by the magnetic orientation of the first ferromagnetic layer 108, in the same direction as the magnetic orientation of the first ferromagnetic layer 108, due to ferromagnetic coupling. In other words, in this example, the orientation of the output magnet 112 will be in the −Z direction, indicating a value of {0}, which is same as the output P.

Figure 4:
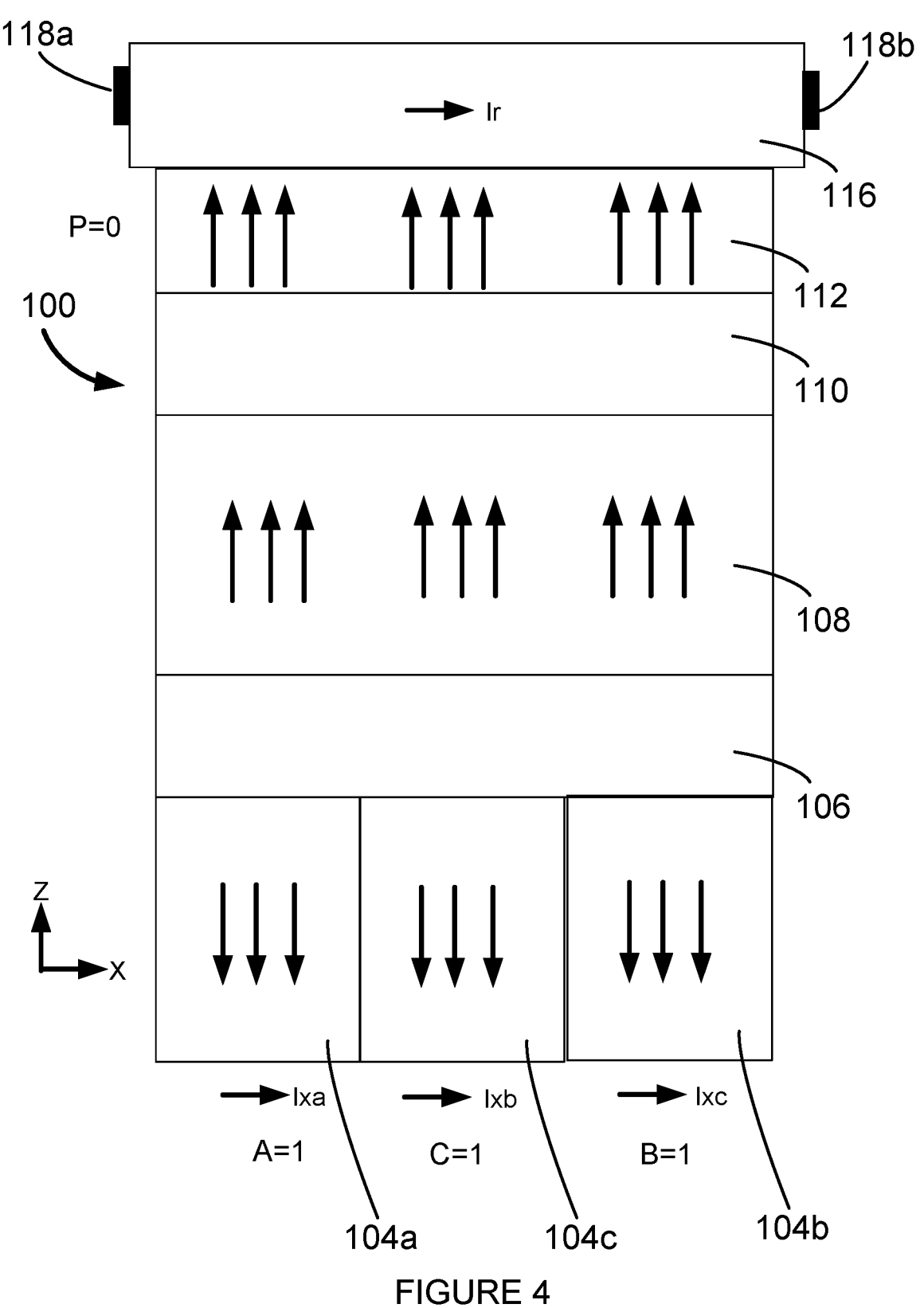
FIG. 4 shows an example implementation of a read circuit for the logic device, according to one aspect of the present disclosure.

As one skilled in the art appreciate, a suitable sensor may be operatively disposed relative to the output magnet 112 to selectively measure the magnetic orientation of the output magnet 112, to determine a polarity of the magnetic domain, thereby determining a value of 0 or 1. FIG. 4 shows an example implementation of a sensing device. Referring to FIG. 4, in one example, a sense layer 116 is disposed over the output magnet 112. The sense layer 116 includes a first read conductive pad 118a and a second read conductive pad 118b. In one example, based on the magnetic orientation of the output magnet 112, a read current is induced in the sense layer 116. For example, the induced current will be either in +X or −X direction. Based on the direction of the induced current, the direction of magnetic orientation of the output magnet 112 may be determined. The direction of the induced read current in the sense layer 116 may be advantageously used to determine the magnetic orientation of the output magnet 112.

In one example, the sense layer 116 is a topological insulator. In one example, through spin pumping, the spin current in the output magnet 112 is converted into charge current in the sense layer. In this example, for an input of {1,1,1}, the magnetic orientation in the output magnet is in −Z direction, which will result in an induced read current Ir in the sense layer 116 will be in the direction of +X axis. In other words, the induced read current Ir will flow from read conductive pad 118a to read conductive pad 118b.

Spin current detection is also feasible through various mechanisms like the inverse spin hall effect (ISHE), the inverse Edelstein effect (IEE), and inverse Rashba-Edelstein effect (IREE). These effects have been realized in heavy metals and topological insulators. Strong spin-pumping signals can be obtained and avoid spurious effects in spin-pumping signal can be achieved through ferromagnetic resonance (FMR) in low-damping ferromagnetic insulators. In some examples, spin-momentum locking in crystalline topological insulators is considered an efficient mechanism for the spin-to-charge conversion.

Figure 5:
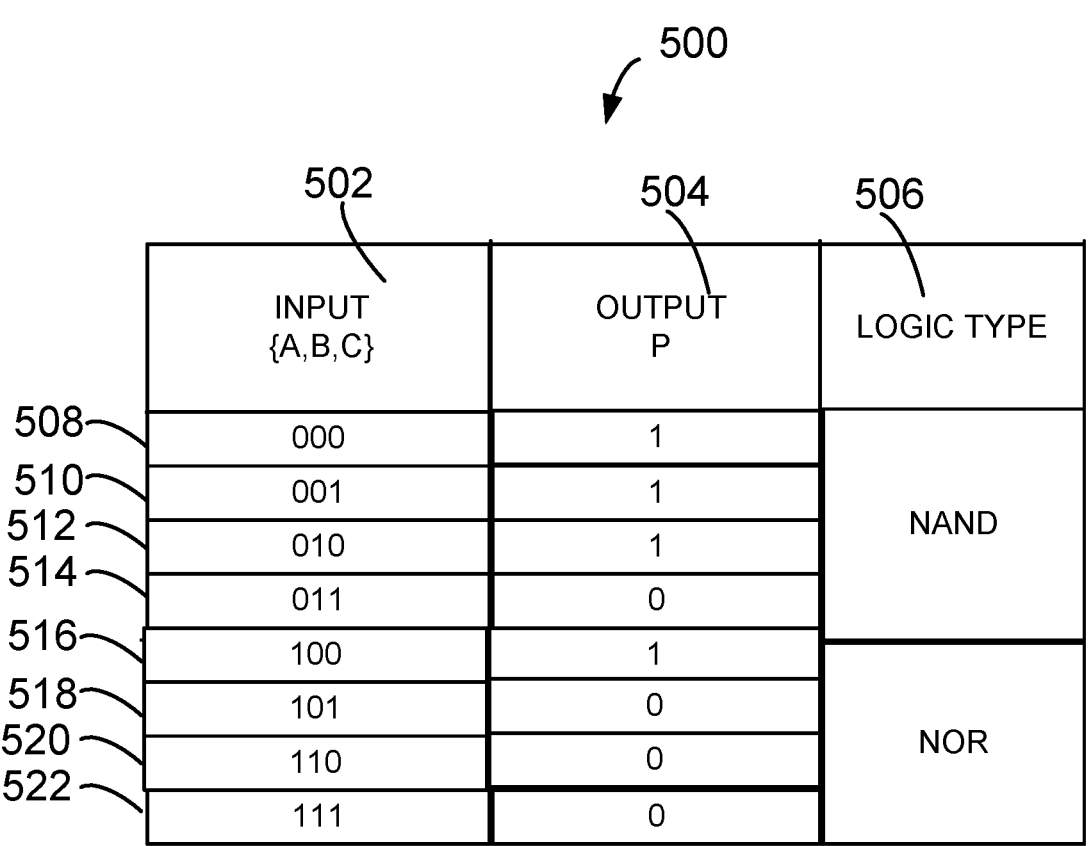
FIG. 5 shows an example table, showing various inputs to the logic device and corresponding outputs of the logic device, according to one aspect of the present disclosure.

Now, referring to FIG. 5, an example table 500 is described. Column 502 shows various inputs to the first input nanomagnet 104a, the second nanomagnet 104b, and the third nanomagnet 104c. Column 504 shows various outputs of the output magnet 112, based on various inputs. Column 506 shows the logic type, either a NAND logic or a NOR logic. Rows 508, 510, 512, and 514 show various inputs and corresponding outputs of the logic device, implementing a NAND logic, as previously described with reference to FIGS. 2A, 2B, 2C, and 2D respectively. Rows 516, 518, 520, and 522 show various inputs and corresponding outputs of the logic device, implementing a NOR logic, as previously described with reference to FIGS. 3A, 3B, 3C, and 3D respectively.

Now, referring to FIG. 6, an example flow diagram 600 is described. In block S602, a first substrate, a second substrate, and a third substrate are provided. For example, first substrate 102a, second substrate 102b, and third substrate 102c are provided.

In block S604, a first input nanomagnet is disposed over the first substrate, a second input nanomagnet is disposed over the second substrate, and a third input nanomagnet is disposed over the third substrate, wherein an easy axis of the first input nanomagnet, second input nanomagnet, and third input nanomagnet are in a first direction perpendicular to the first substrate, the second substrate, and the third substrate. For example, a first input nanomagnet 104a is disposed over the first substrate 102a, a second input nanomagnet 104b is disposed over the second substrate 102b, and a third input nanomagnet 104c is disposed over the third substrate 102c. The easy axis of the first input nanomagnet 104a, the second input nanomagnet 104b, and the third input nanomagnet 104c are in a first direction perpendicular to the first substrate 102a, the second substrate 102b, and the third substrate 102c. For example, the first substrate, the second substrate, and the third substrate are disposed along X, Y axis and the easy axis of the first input nanomagnet, second input nanomagnet, and the third input nanomagnet are along Z axis perpendicular to the X, Y axis.

In block S606, a spacer layer is disposed over the first input nanomagnet, the second input nanomagnet, and the third input nanomagnet. For example, a spacer layer 106 is disposed over the first input nanomagnet 104a, the second input nanomagnet 104b, and the third input nanomagnet 104c.

In block S608, a first ferromagnetic layer is disposed over the spacer layer. For example, first ferromagnetic layer 108 is disposed over the spacer layer 106.

In some examples, there can be a plurality of sub-stacks of first ferromagnetic layer and the spacer layer stacked over each other, for example, along the Z axis. One of the advantages of stacking a plurality of sub-stacks of first ferromagnetic layer and the spacer layer is better thermal stability. As one skilled in the art appreciates, in this example construction, the perpendicular anisotropy based memory device by using spin orbit torque (SOT) effect provides faster switching speeds, as compared to a longitudinal anisotropy based memory device, for example, a memory device using spin transfer torque (STT) effect. In some examples, sub-nanosecond switching speeds can be achieved in the memory device using the SOT effect. Further, charge current density required to switch the orientation of magnetization in the first ferromagnetic material may be achieved in the range of about 5e10 Amperes/meter which corresponds to the charge current density Jy of first charge current Iy which is higher than the charge current density Jx for the second charge current Ix. The switching current is scalable in the example device, as much smaller current densities are possible using Topological Insulators with large charge to spin conversion. Due to negligible incubation time using SOT effect, sub-nanosecond switching is possible in the example device.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that phraseology or terminology employed herein is for the purpose of description and not of limitation.

While embodiments of the present invention are described above with respect to what is currently considered its preferred embodiments, it is to be understood that the invention is not limited to that described above. To the contrary, the invention is intended to cover various modifications and equivalent arrangements within the spirit and scope of the appended claims.

What is claimed is:

1. A method, including:
providing a first substrate, a second substrate and a third substrate;
disposing a first input nanomagnet over the first substrate;
disposing a second input nanomagnet over the second substrate;
disposing a third input nanomagnet over the third substrate,
wherein, an easy axis of the first input nanomagnet, the second input nanomagnet and the third input nanomagnet are in a first direction substantially perpendicular to the first substrate, the second substrate and the third substrate respectively;
disposing a spacer layer over the first nanomagnet, the second input nanomagnet and the third input nanomagnet; and
disposing a first ferromagnetic layer over the spacer layer.

2. The method of claim 1, further including selectively passing a first charge current pulse through the first substrate, the second substrate, and the third substrate, along a direction perpendicular to the first direction to orient magnetization of the first input nanomagnet, the second input nanomagnet, and the third input nanomagnet in a second direction perpendicular to the first direction; and
selectively passing a second charge current pulse through the first substrate, the second substrate, and the third substrate, to selectively magnetize the first input nanomagnet, the second input nanomagnet, and the third input nanomagnet,
wherein a direction of the second charge current switches the orientation of the magnetization of the first input nanomagnet, the second input nanomagnet, and the third input nanomagnet to either the first direction or a direction opposite to the first direction, based on a direction of the second charge current, and
wherein the direction of switched orientation of the magnetization of the first input nanomagnet, the second input nanomagnet, and the third input nanomagnet indicates a first value or a second value.

3. The method of claim 2, wherein the direction of orientation of the first nanomagnet, the second nanomagnet, and the third nanomagnet cumulatively set a direction of orientation of the first ferromagnetic layer.

4. The method of claim 3, further including:
changing the direction of orientation of the first ferromagnetic layer, by selectively changing direction of current flow of the second charge current in one or more of the first input nanomagnet, the second input nanomagnet, and the third input nanomagnet.

5. The method of claim 3, wherein the first input nanomagnet, the second input nanomagnet, the third input nanomagnet and the first ferromagnetic layer each have a first direction of orientation and a second direction of orientation, with the first direction of orientation substantially opposite to the second direction of orientation, wherein, the first direction of orientation is indicative of a value of zero, and the second direction of orientation is indicative of a value of one.

6. The method of claim 5, wherein,
when at least two or all of the first input nanomagnet, the second input nanomagnet and the third input nanomagnet have a first direction of orientation, the direction of orientation of the first ferromagnetic layer is substantially in the second direction of orientation.

7. The method of claim 5, wherein,
when two or more of the first input nanomagnet, the second input nanomagnet and the third input nanomagnet have a second direction of orientation, the direction of orientation of the first ferromagnetic layer is substantially in the first direction of orientation.

8. The method of claim 2, wherein, the first substrate, the second substrate, and the third substrate are each composed of a heavy metal or a topological insulator,
wherein, the second charge current produce a spin orbit torque in the first substrate, the second substrate, and the third substrate and drives an orientation of magnetic field in the first input nanomagnet, the second input nanomagnet, and the third input nanomagnet; and
the first ferromagnetic layer separated by the spacer layer obtains an antiferromagnetic coupling from the first input nanomagnet, the second input nanomagnet, and the third input nanomagnet.

9. The method of claim 8, wherein a majority of the orientation of the first input nanomagnet, the second input nanomagnet, and the third input nanomagnet determines the orientation of the first ferromagnetic layer.

10. The method of claim 1, further including,
disposing a barrier layer over the first ferromagnetic layer;
disposing an output magnet over the barrier layer, wherein the output magnet obtains a ferromagnetic coupling from the first ferromagnetic layer; and
disposing a sense layer over the output magnet, wherein a direction of the current induced depends on the magnetization direction of the output magnet.

11. A logic device, including:
a first substrate, a second substrate and a third substrate;
a first input nanomagnet disposed over the first substrate;

a second input nanomagnet disposed over the second substrate;

a third input nanomagnet disposed over the third substrate, wherein, an easy axis of the first input nanomagnet, the second input nanomagnet and the third input nanomagnet are in a first direction substantially perpendicular to the first substrate, the second substrate and the third substrate respectively;

a spacer layer disposed over the first nanomagnet, the second input nanomagnet and the third input nanomagnet; and a first ferromagnetic layer disposed over the spacer layer.

12. The logic device of claim 11, wherein, a first charge current pulse is selectively passed through the first substrate, the second substrate, and the third substrate, along a direction perpendicular to the first direction to orient magnetization of the first input nanomagnet, the second input nanomagnet, and the third input nanomagnet in a second direction perpendicular to the first direction; and a second charge current pulse is selectively passed through the first substrate, the second substrate, and the third substrate, to selectively magnetize the first input nanomagnet, the second input nanomagnet, and the third input nanomagnet, wherein a direction of the second charge current switches the orientation of the magnetization of the first input nanomagnet, the second input nanomagnet, and the third input nanomagnet to either the first direction or a direction opposite to the first direction, based on a direction of the second charge current, and wherein the direction of switched orientation of the magnetization of the first input nanomagnet, the second input nanomagnet, and the third input nanomagnet indicates a first value or a second value.

13. The logic device of claim 12, wherein the direction of orientation of the first nanomagnet, the second nanomagnet, and the third nanomagnet cumulatively set a direction of orientation of the first ferromagnetic layer.

14. The logic device of claim 13, wherein, the direction of orientation of the first ferromagnetic layer is changed by selectively changing direction of current flow of the second charge current in one or more of the first input nanomagnet, the second input nanomagnet, and the third input nanomagnet.

15. The logic device of claim 13, wherein the first input nanomagnet, the second input nanomagnet, the third input nanomagnet and the first ferromagnetic layer each have a first direction of orientation and a second direction of orientation, with the first direction of orientation substantially opposite to the second direction of orientation, wherein, the first direction of orientation is indicative of a value of zero, and the second direction of orientation is indicative of a value of one.

16. The logic device of claim 15, wherein, when at least two or all of the first input nanomagnet, the second input nanomagnet and the third input nanomagnet have a first direction of orientation, the direction of orientation of the first ferromagnetic layer is substantially in the second direction of orientation.

17. The logic device of claim 15, wherein, when two or more of the first input nanomagnet, the second input nanomagnet and the third input nanomagnet have a second direction of orientation, the direction of orientation of the first ferromagnetic layer is substantially in the first direction of orientation.

18. The logic device of claim 12, wherein, the first substrate, the second substrate, and the third substrate are each composed of a heavy metal, or a topological insulator, wherein, the second charge current produce a spin orbit torque in the first substrate, the second substrate, and the third substrate and drives an orientation of magnetic field in the first input nanomagnet, the second input nanomagnet, and the third input nanomagnet; and the first ferromagnetic layer separated by the spacer layer obtains an antiferromagnetic coupling from the first input nanomagnet, the second input nanomagnet, and the third input nanomagnet.

19. The logic device of claim 18, wherein a majority of the orientation of the first input nanomagnet, the second input nanomagnet, and the third input nanomagnet determines the orientation of the first ferromagnetic layer.

20. The logic device of claim 11, further including, a barrier layer disposed over the first ferromagnetic layer;

an output magnet disposed over the barrier layer, wherein the output magnet obtains a ferromagnetic coupling from the first ferromagnetic layer; and a sense layer disposed over the output magnet, wherein a direction of the current induced in the sense layer depends on the magnetization direction of the output magnet.

* * * * *